(12) United States Patent
Yin et al.

(10) Patent No.: US 11,139,784 B2
(45) Date of Patent: Oct. 5, 2021

(54) AUDIO PLAY CIRCUIT AND AUDIO PLAY DEVICE

(71) Applicant: HUAWEI TECHNOLOGIES CO., LTD., Guangdong (CN)

(72) Inventors: Deyang Yin, Shenzhen (CN); Jun Li, Shanghai (CN); Ding Li, Shenzhen (CN); Shuai Du, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/828,425

(22) Filed: Mar. 24, 2020

(65) Prior Publication Data

US 2020/0228069 A1 Jul. 16, 2020

Related U.S. Application Data

(63) Continuation of application No. PCT/CN2018/085627, filed on May 4, 2018.

(30) Foreign Application Priority Data

Oct. 31, 2017 (CN) .......................... 201711061795.7

(51) Int. Cl.
*H03F 1/32* (2006.01)
*H03F 1/02* (2006.01)

(52) U.S. Cl.
CPC ......... *H03F 1/3264* (2013.01); *H03F 1/0211* (2013.01); *H03F 2200/03* (2013.01)

(58) Field of Classification Search
CPC combination set(s) only.
See application file for complete search history.

(56) References Cited

U.S. PATENT DOCUMENTS

| 4,788,508 A | 11/1988 | Kawai |
| 2005/0025322 A1 | 2/2005 | Henson et al. |

(Continued)

FOREIGN PATENT DOCUMENTS

| CN | 101309071 A | 11/2008 |
| CN | 101350594 A | 1/2009 |

(Continued)

OTHER PUBLICATIONS

21dianyuan.com [online], "[Discussion] A very simple question: the resistance and the capacitor are connected to the ground in parallel," retrieved from URL <http://bbs.21dianyuan.com/thread-169776-1-1.html>, Dec. 26, 2013, 2 pages.

(Continued)

*Primary Examiner* — Junpeng Chen
(74) *Attorney, Agent, or Firm* — Fish & Richardson P.C.

(57) ABSTRACT

An example audio play circuit includes a power supply module, a power amplifier, a coupling capacitor, a load, and a plosive suppression circuit. An output terminal of the power amplifier is connected to a first terminal of the coupling capacitor and an output terminal of the plosive suppression circuit, a second terminal of the coupling capacitor is connected to the load, and an output terminal of the power supply module is connected to a power supply terminal of the power amplifier and a power supply terminal of the plosive suppression circuit. The power supply module is configured to provide a direct current power supply voltage for the power amplifier and the plosive suppression circuit. When the direct current power supply voltage rises to the first voltage threshold, the plosive suppression circuit connects the first terminal of the coupling capacitor to the ground terminal.

19 Claims, 6 Drawing Sheets

(56) References Cited

U.S. PATENT DOCUMENTS

| | | | |
|---|---|---|---|
| 2005/0195991 A1 | 9/2005 | Wang et al. | |
| 2005/0253650 A1* | 11/2005 | Chang | H03F 3/68 330/51 |
| 2006/0023896 A1 | 2/2006 | Ginsberg et al. | |
| 2006/0182265 A1 | 8/2006 | Sorace et al. | |
| 2006/0182266 A1 | 8/2006 | Cusinato et al. | |
| 2009/0196435 A1* | 8/2009 | Miao | H03F 1/305 381/94.5 |
| 2010/0128886 A1* | 5/2010 | Tseng | H03G 3/348 381/73.1 |
| 2010/0315163 A1 | 12/2010 | Takagi et al. | |
| 2011/0158435 A1* | 6/2011 | Ono | H03F 1/0261 381/120 |
| 2012/0105153 A1* | 5/2012 | Doi | H03F 1/305 330/149 |

FOREIGN PATENT DOCUMENTS

| | | |
|---|---|---|
| CN | 101742380 A | 6/2010 |
| CN | 101939909 A | 1/2011 |
| CN | 103248985 A | 8/2013 |
| CN | 105554634 A | 5/2016 |
| CN | 105578354 A | 5/2016 |
| CN | 106656065 A | 5/2017 |
| JP | 2006128909 A | 5/2006 |
| JP | 2012004675 A | 1/2012 |
| KR | 20040007161 A | 1/2004 |
| WO | 2005096529 A1 | 10/2005 |
| WO | 2011003691 A1 | 1/2011 |

OTHER PUBLICATIONS

Office Action issued in Chinese Application No. 201711061795.7 dated Feb. 20, 2021, 17 pages (with English translation).

Extended European Search Report issued in European Application No. 18874131.8 dated Sep. 21, 2020, 10 pages.

International Electrotechnical Commission, "Electroacoustics—Sound level meters" Norme Internationale International Standard, CEI IEC 61672-2, Part 2: Pattern evaluation tests, Apr. 2003, 88 pages (With English translation).

Wikipedia.org [Online], "A-weighting", created on May 14, 2017, [retrieved on May 30, 2020], retrieved from : URL <https://en.wikipedia.org/wiki/A-weighting>, 7 pages.

PCT International Search Report and Written Opinion in International Application No. PCT/CN2018/085,627, dated Jul. 13, 2018, 18 pages (With English Translation).

Office Action issued in Chinese Application No. 201711061795.7 dated May 25, 2020, 18 pages (With English Translation).

Haishi, "Research on Noise Suppression Techniques of Low Power Audio Subsystem," University of Electronic Science and Technology, Issue 12, 2013, 3 pages (English abstract).

Office Action issued in Chinese Application No. 201711061795.7 dated Jul. 12, 2021, 6 pages (with English translation).

Omer et al., "A PA-Noise Cancellation Technique for Next Generation Highly Integrated RF Front-Ends," RTUIF6, 2012 IEEE Radio Frequency Integrated Circuits Symposium, Jul. 2012, 4 pages.

* cited by examiner

AUDIO PLAY CIRCUIT AND AUDIO PLAY DEVICE

CROSS-REFERENCE TO RELATED APPLICATION

This application is a continuation Application of International Patent application No. PCT/CN2018/085627, filed on May 4, 2018, which claims priority to Chinese Patent Application No. 201711061795.7, filed on Oct. 31, 2017. The disclosures of the aforementioned applications are hereby incorporated by reference in their entireties.

TECHNICAL FIELD

Aspects of this application relate to the field of electronics and power, and in particular, to an audio play circuit and an audio play device.

BACKGROUND

When an audio play device such as a sound box or a headset is powered on, an unpleasant "squeaky" sound is usually generated. Such an unpleasant sound is referred to as a plosive, and may also be referred to as a pop noise or a noise. The audio play device generally includes an audio amplifier circuit, a coupling capacitor, and a load, and the audio amplifier circuit is connected to the load using the coupling capacitor.

For an audio play device powered by a single power supply, before the single power supply is powered on, an output node of an audio amplifier circuit is an indefinite level close to 0. After the single power supply is powered on, the output node instantly changes from the indefinite level close to 0 to an indefinite level with a specific level value (an indefinite level from 0 to a voltage of the single power supply). The level of the output node rapidly changes from the indefinite level close to 0 to the indefinite level with the specific level value, and such a rapid level change may be coupled to a load using a coupling capacitor, thereby generating a plosive.

SUMMARY

A technical issue to be resolved by the embodiments of the present application is to provide an audio play circuit and an audio play device, to suppress a plosive generated by the audio play device in a power-on process of a power supply module.

A first aspect of the embodiments of the present application provides an audio play circuit, including a power supply module, a power amplifier, a coupling capacitor, a load, and a plosive suppression circuit, where an output terminal of the power amplifier is connected to a first terminal of the coupling capacitor and an output terminal of the plosive suppression circuit, a second terminal of the coupling capacitor is connected to the load, an output terminal of the power supply module is connected to a power supply terminal of the power amplifier and a power supply terminal of the plosive suppression circuit, and the power supply module is configured to provide a direct current power supply voltage for the power amplifier and the plosive suppression circuit;

the plosive suppression circuit is configured to: when the direct current power supply voltage is less than a first voltage threshold, disconnect the first terminal of the coupling capacitor from a ground terminal, where the first voltage threshold is less than a working voltage threshold of the power amplifier; and the plosive suppression circuit is further configured to: when the direct current power supply voltage rises to the first voltage threshold, connect the first terminal of the coupling capacitor to the ground terminal.

The load may be a speaker or a loudspeaker, and a working voltage threshold of the plosive suppression circuit is the first voltage threshold less than the working voltage threshold of the power amplifier. When the direct current voltage output by the power supply module rises to the first voltage threshold, the plosive suppression circuit starts to work, and the output terminal of the plosive suppression circuit is grounded, such that the first terminal of the coupling capacitor is grounded. In a power-on process of the power supply module, the first terminal of the coupling capacitor is grounded, to prevent a level jump at the output terminal of the power amplifier in the power-on process of the power supply module, and further prevent generation of a plosive resulting from coupling of the level jump to the load using the coupling capacitor. In this way, a plosive generated in the power-on process of the power supply module can be suppressed.

Optionally, the audio play circuit further includes a controller, and the plosive suppression circuit includes a reset module, a flip-flop, a capacitor-resistor parallel module, a level inverter, and a first switching transistor. An output terminal of the reset module is connected to a reset terminal of the flip-flop, an input terminal of the flip-flop is connected to a first control terminal of the controller, an output terminal of the flip-flop is connected to a first terminal of the capacitor-resistor parallel module and an input terminal of the level inverter, an output terminal of the level inverter is connected to a control terminal of the first switching transistor, a first terminal of the first switching transistor is connected to the output terminal of the power amplifier, a second terminal of the first switching transistor and a second terminal of the capacitor-resistor parallel module are connected to the ground terminal, and a working voltage threshold of the level inverter is equal to the first voltage threshold.

The output terminal of the power supply module is connected to a power supply terminal of the controller, a power supply terminal of the reset module, a power supply terminal of the flip-flop, and a power supply terminal of the level inverter, and the power supply module is configured to provide the direct current power supply voltage for the reset module, the flip-flop, and the level inverter.

The capacitor-resistor parallel module is configured to: when the power supply module starts to work, input a first low level signal to the input terminal of the level inverter.

The level inverter is configured to: when the direct current power supply voltage rises to the first voltage threshold, output a first high level signal to the control terminal of the first switching transistor based on the first low level signal, where the first high level signal is used to control the first switching transistor to be turned on.

The first switching transistor T1 is a switching transistor turned on using a high level signal, and the capacitor-resistor parallel module is configured to: after the power supply module is powered on and before the flip-flop starts to work, pull down an indefinite level output by the flip-flop to an earth level, to prevent an indefinite level output by the flip-flop in the power-on process from being coupled to the input terminal of the level inverter. This ensures that after the power supply module is powered on and before the flip-flop starts to work, a signal of the input terminal of the level inverter is a low level signal and does not jump, such that and further ensures that the level inverter outputs a stable high level signal after starting to work, so as to ensure that the first switching transistor is stably in an on state, such that stability of working of the plosive suppression circuit is ensured.

Optionally, the flip-flop is a D flip-flop, where the D flip-flop has a dedicated reset terminal, and may be directly controlled by the reset module.

Optionally, a working voltage threshold of the reset module is a second voltage threshold, a working voltage threshold of the flip-flop is a third voltage threshold, and a working voltage threshold of the controller is less than the second voltage threshold, where the second voltage threshold is greater than the first voltage threshold, and the second voltage threshold is less than or equal to the third voltage threshold.

The reset module is configured to: when the direct current power supply voltage rises to the second voltage threshold, send a reset signal to the flip-flop.

The controller is configured to: when the direct current power supply voltage rises to the second voltage threshold, output a second low level signal to the input terminal of the flip-flop using the first control terminal.

The flip-flop is configured to: when the direct current power supply voltage rises to the third voltage threshold, output the second low level signal to the input terminal of the level inverter based on the reset signal and the second low level signal.

The level inverter is further configured to output a second high level signal to the control terminal of the first switching transistor based on the second low level signal, where the second high level signal is used to control the first switching transistor to be turned on.

After the power supply module is powered on and the level inverter starts to work, the controller and the reset module control the flip-flop to start to work, such that the flip-flop outputs a low level signal to the input terminal of the level inverter, to ensure that the level inverter continues to output a high level signal capable of turning on the first switching transistor. Compared with the signal output to the level inverter by the capacitor-resistor parallel module, the signal output to the level inverter by the flip-flop is more controllable, such that stability of working of the plosive suppression circuit can be further ensured in the power-on process of the power supply module.

Optionally, the plosive suppression circuit further includes a common-mode voltage generation module, an output terminal of the common-mode voltage generation module is connected to the output terminal of the power amplifier, and the output terminal of the power supply module is connected to a power supply terminal of the common-mode voltage generation module.

The controller is further configured to: when the direct current power supply voltage is in a rising phase, control the output terminal of the common-mode voltage generation module to be disconnected from the ground terminal.

The controller is further configured to: when the direct current power supply voltage stabilizes to a target voltage value, control the output terminal of the common-mode voltage generation module to be connected to the ground terminal.

When the direct current power supply voltage is in the rising phase, it indicates that the power supply module is being powered on. When the direct current power supply voltage stabilizes to the target voltage value, it indicates that the power supply module has been powered on. The common-mode voltage generation module is configured to: when the direct current power supply voltage stabilizes to the target voltage value, connect the output terminal of the common-mode voltage generation module to the ground terminal, such that the first terminal of the coupling capacitor is grounded using the common-mode voltage generation module. The plosive suppression circuit may further ground the first terminal of the coupling capacitor C1 using the common-mode voltage generation module after a single power supply module has been powered on. This can ensure that the first terminal of the coupling capacitor is always grounded after the power supply module has been powered on and before a common-mode voltage is established. In this way, a plosive that may be generated in a process of establishing the common-mode voltage after the power supply module has been powered on can be suppressed.

Optionally, the common-mode voltage generation module includes a reference voltage generation module, an external capacitor, a buffer module, and a second switching transistor. The output terminal of the power supply module is connected to a power supply terminal of the reference voltage generation module and a power supply terminal of the buffer module. The power supply module is configured to provide the direct current power supply voltage for the reference voltage generation module and the buffer module. An output terminal of the reference voltage generation module is connected to a first terminal of the external capacitor and an input terminal of the buffer module. An output terminal of the buffer module is connected to a first terminal of the second switching transistor. A second terminal of the second switching transistor is connected to the output terminal of the power amplifier. A control terminal of the second switching transistor is connected to a second control terminal of the controller. A third control terminal of the controller is connected to a control terminal of the reference voltage generation module. A fourth control terminal of the controller is connected to a control terminal of the buffer module. A second terminal of the external capacitor is connected to the ground terminal.

The controller is further configured to: when the direct current power supply voltage stabilizes to the target voltage value, output a second control signal to the control terminal of the second switching transistor using the second control terminal, output a third control signal to the control terminal of the reference voltage generation module using the third control terminal, and output a fourth control signal to the control terminal of the buffer module using the fourth control terminal, where the second control signal is used to control the second switching transistor to be turned on, the third control signal is used to control the reference voltage generation module to stop working, and the fourth control signal is used to control the buffer module to start to work.

After the power supply module has been powered on and before the common-mode voltage is established, the reference voltage generation module is controlled to stop working, and the buffer module is controlled to work. Because a voltage that is output when the reference voltage generation module stops working is zero, the zero voltage that is output when the reference voltage generation module stops working may be output to the output terminal of the power amplifier using the buffer module, to ensure that the first terminal of the coupling capacitor is always in a grounded state. In this way, a plosive that may be generated after the power supply module has been powered on can be suppressed. The reference voltage generation module does not have a current driving capability, and cannot directly drive the output terminal (an output node) of the power amplifier.

Therefore, the buffer module is added, such that a reference voltage generated by the reference voltage generation module can drive the output terminal of the power amplifier.

Optionally, the controller is further configured to: after the second switching transistor is turned on, output a third high level signal to the input terminal of the flip-flop using the first control terminal.

The flip-flop is further configured to output the third high level signal to the input terminal of the level inverter.

The level inverter is further configured to output a third low level signal to the control terminal of the first switching transistor based on the third high level signal, where the third low level signal is used to control the first switching transistor to be turned off.

The common-mode voltage may also be referred to as a reference voltage or a reference voltage, to provide a voltage reference. After the power supply module has been powered on and before the common-mode voltage is established, because the power supply module has been powered on, to establish the common-mode voltage at the output terminal of the power amplifier, the first switching transistor is turned off using the controller, such that the plosive suppression circuit stops working. In this way, establishing the common-mode voltage at the output terminal of the power amplifier is not affected after the first switching transistor is turned on.

Optionally, the controller is further configured to: after the second switching transistor is turned on and the first switching transistor is turned off, output a fifth control signal to the control terminal of the reference voltage generation module using the third control terminal, where the fifth control signal is used to control the reference voltage generation module to start to work.

When the reference voltage generation module starts to work, due to existence of the external capacitor, the reference voltage output by the reference voltage generation module slowly rises to a final reference voltage value, and the buffer module also outputs the slowly rising reference voltage to the output terminal of the power amplifier, to drive a voltage at the output terminal of the power amplifier to be the final reference voltage value. In this way, the common-mode voltage is established at the output terminal of the power amplifier. In a process of establishing the common-mode voltage, the voltage at the output terminal of the power amplifier rises slowly and does not change abruptly, such that the plosive that may be generated in the process of establishing the common-mode voltage can be suppressed. After the common-mode voltage at the output terminal of the power amplifier is established, and when the power amplifier starts to work, because input of the power amplifier is zero, a voltage initially output by the power amplifier is also a common-mode voltage, and a voltage jump is not caused at the output terminal of the power amplifier. In this way, a plosive caused by a voltage change at the output terminal of the power amplifier is suppressed.

Optionally, a capacitance value of the external capacitor is greater than a preset capacitance threshold.

The capacitance value of the external capacitor is greater than the preset capacitance threshold, such that so as to ensure that a voltage output to the output terminal of the power amplifier by the buffer module changes steadily. In this way, a plosive caused by a voltage change at the output terminal of the power amplifier is suppressed.

Optionally, the audio play circuit further includes a digital-to-analog converter, an input terminal of the digital-to-analog converter is connected to an output terminal of the controller, an output terminal of the digital-to-analog converter is connected to an input terminal of the power amplifier, and a power supply terminal of the digital-to-analog converter is connected to the output terminal of the power supply module.

The digital-to-analog converter is configured to convert a digital audio signal output by the controller into an analog audio signal, and output the analog audio signal to the power amplifier.

Optionally, when the power supply module works, a voltage change rate in a process in which the direct current power supply voltage output by the power supply module changes from zero to the target voltage value is less than a preset change rate threshold.

The direct current power supply voltage output by the power supply module does not jump from zero to the final target voltage value, but has a slow rising process, to avoid a case in which a plosive suppression effect of the plosive suppression circuit is affected because the plosive suppression circuit fails to respond in a timely manner due to a sudden change of a voltage output by the power supply module.

A second aspect of the embodiments of the present application provides an audio play device, including the plosive suppression circuit according to the first aspect of the embodiments of the present application.

A third aspect of the embodiments of the present application provides an audio play circuit, including a power supply module, a power amplifier, a coupling capacitor, and a plosive suppression circuit, where the power amplifier is configured to receive an analog signal, amplify the analog signal, and output an amplified analog signal to an external play device using the coupling capacitor;

the power supply module is configured to provide a working voltage for the power amplifier and the plosive suppression circuit;

two terminals of the coupling capacitor are respectively connected to an output terminal of the power amplifier and an input terminal of the external play device; and the plosive suppression circuit is configured to: when the working voltage exceeds a threshold, ground one terminal of the coupling capacitor.

The one terminal of the coupling capacitor may be a first terminal of the coupling capacitor, or may be a second terminal of the coupling capacitor. The plosive suppression circuit may ground the output terminal of the power amplifier or the input terminal of the external play device when the working voltage exceeds the threshold, to prevent generation of a plosive resulting from coupling of a level jump at the output terminal of the power amplifier in a power-on process of the power supply module to the external play device using the coupling capacitor. In this way, a plosive generated in the power-on process of the power supply module can be suppressed.

According to the embodiments of the present application, when the direct current voltage output by the power supply module rises to the first voltage threshold, the plosive suppression circuit starts to work, and the output terminal of the plosive suppression circuit is grounded, such that the first terminal of the coupling capacitor is grounded. In the power-on process of the power supply module, before the power amplifier starts to work, the plosive suppression circuit grounds the output terminal of the power amplifier, to prevent a level jump at the output terminal of the power amplifier in the power-on process of the power supply module, and further prevent generation of a plosive resulting from coupling of the level jump to the load using the coupling capacitor. In this way, a plosive generated in the power-on process of the power supply module can be suppressed.

BRIEF DESCRIPTION OF DRAWINGS

To describe the technical solutions in the embodiments of the present application or in the background more clearly, the following describes the accompanying drawings required in the embodiments of the present application or the background.

DESCRIPTION OF EMBODIMENTS

The following describes the embodiments of the present application with reference to the accompanying drawings in the embodiments of the present application.

Figure 1:
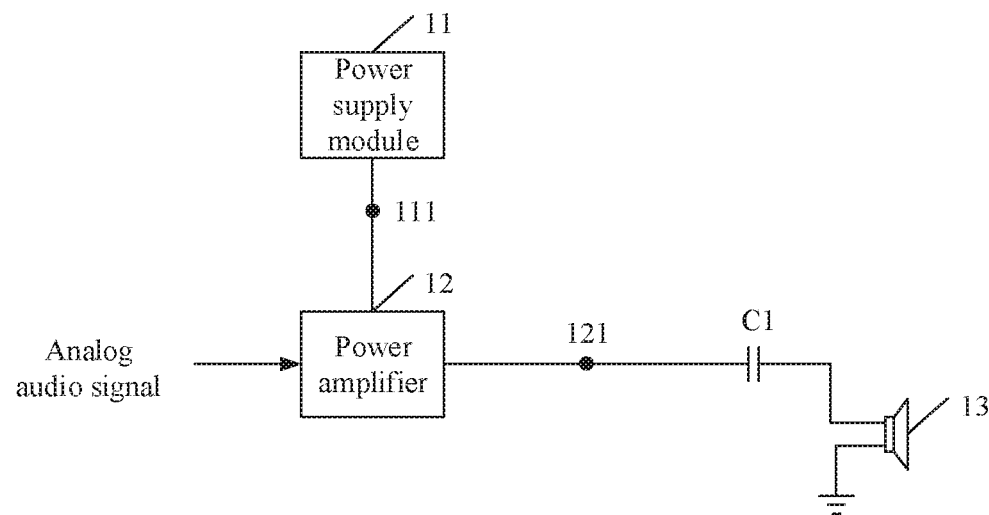
FIG. 1 is a schematic structural diagram of an audio play circuit according to an embodiment of the present application.

FIG. 1 is a schematic structural diagram of an audio play circuit according to an embodiment of the present application. As shown in FIG. 1, the audio play circuit may include a power supply module 11, a power amplifier 12, a coupling capacitor C1, and a load 13. An output terminal of the power supply module 11 is connected to a power supply terminal of the power amplifier 12, an input terminal of the power amplifier 12 receives an analog audio signal, an output terminal of the power amplifier 12 is connected to a first terminal of the coupling capacitor C1, a second terminal of the coupling capacitor C1 is connected to a positive electrode of the load 13, and a negative electrode of the load 13 is grounded. The power amplifier 12 amplifies the received analog audio signal, and outputs an amplified analog audio signal to the load 13 using the coupling capacitor C1. The power supply module 11 described in this embodiment of the present application may be a single power supply module. The single power supply module is a power supply module having only a positive power supply or a negative power supply, is capable of outputting only a positive voltage or a negative voltage, and is different from a dual-voltage module that is capable of outputting a positive voltage and a negative voltage. For example, if a nominal voltage of the single power supply module is 5 V, an output voltage range is 0 V to 5 V; and if a nominal voltage of the dual-voltage module is +5 V, an output voltage range is −5 V to +5 V.

In this embodiment of the present application, the load 13 is an alternating current load, and the load 13 may be driven by an alternating current signal. The coupling capacitor C1 is configured to isolate a direct current signal output by the power amplifier 12, to avoid interference caused by the direct current signal on the load 13 to the load 13. The load 13 may be a speaker or a loudspeaker. The analog audio signal may be input by an analog signal generator (for example, a digital-to-analog converter). The power supply module 11 may provide a direct current power supply voltage for the power amplifier 12. It is assumed that the direct current power supply voltage provided by the power supply module 11 ranges from 0 to VDD, where VDD is a maximum voltage that can be output by the power supply module 11. Before the power supply module 11 is powered on, an output node of the power amplifier 12 is an indefinite level close to 0. After the power supply module 11 has been powered on, and when the power amplifier 12 does not receive the audio analog signal, the output node of the power amplifier 12 outputs an indefinite level between 0 and VDD under an influence of the power supply module 11. When the plosive suppression circuit in this embodiment of the present application is not used, before and after the power supply module 11 is powered on, an indefinite level jumps at the output node of the power amplifier 12, and such a jump is easily transferred to the load 13 using the coupling capacitor C1, thereby generating a plosive. The plosive may also be referred to as a pop noise or a noise.

Figure 2:
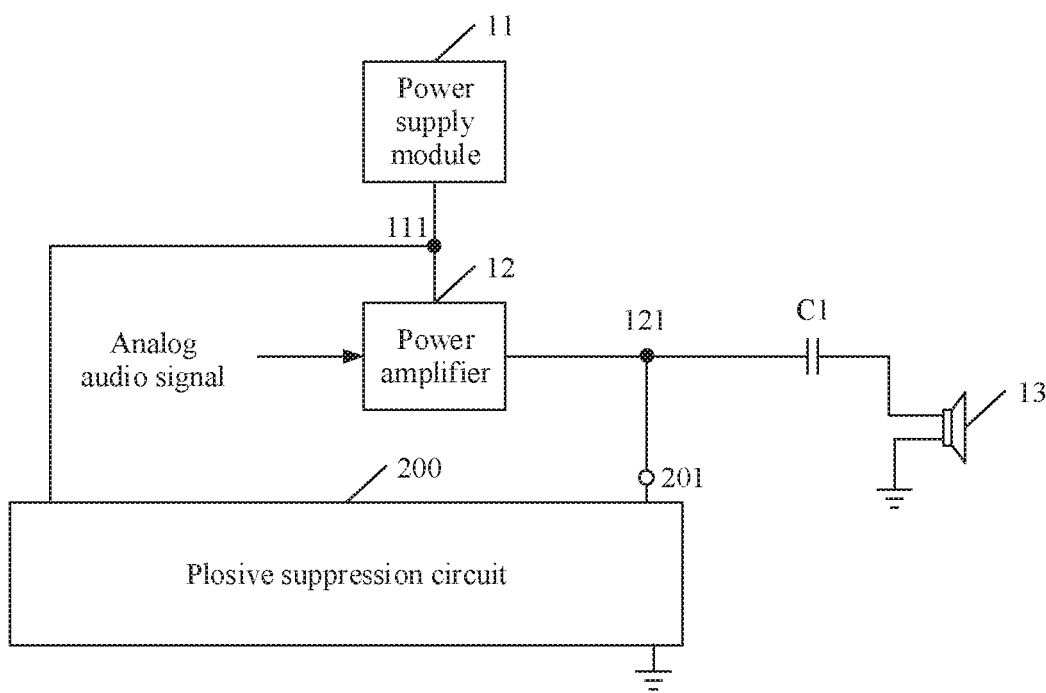
FIG. 2 is a schematic structural diagram of another audio play circuit according to an embodiment of the present application.

FIG. 2 is a schematic structural diagram of another audio play circuit according to an embodiment of the present application. The audio play circuit in FIG. 2 is designed based on FIG. 1 to suppress a plosive. As shown in FIG. 2, in addition to all the modules in FIG. 1, the audio play circuit further includes a plosive suppression circuit 200.

An output terminal 121 of a power amplifier 12 is connected to a first terminal of a coupling capacitor C1 and an output terminal 201 of the plosive suppression circuit 200, a second terminal of the coupling capacitor C1 is connected to a load 13, an output terminal 111 of a power supply module 11 is connected to a power supply terminal of the power amplifier 12 and a power supply terminal of the plosive suppression circuit 200, and the power supply module 11 is configured to provide a direct current power supply voltage for the power amplifier 12 and the plosive suppression circuit 200.

The plosive suppression circuit 200 is configured to: when the direct current power supply voltage is less than a first voltage threshold, disconnect the first terminal of the coupling capacitor C1 from a ground terminal GND, where the first voltage threshold is less than a working voltage threshold of the power amplifier 12.

The plosive suppression circuit 200 is further configured to: when the direct current power supply voltage rises to the first voltage threshold, connect the first terminal of the coupling capacitor C1 to the ground terminal.

In this embodiment of the present application, after the power supply module 11 is powered on, the power supply voltage output by the power supply module 11 starts to rise from 0, and when the power supply voltage output by the power supply module 11 rises to VDD and remains stable, the power supply module 11 has been powered on. A minimum voltage threshold at which the plosive suppression circuit 200 can work is the first voltage threshold. When the power supply voltage output by the power supply module 11 is less than the first voltage threshold, because the power supply voltage output by the power supply module 11 is relatively low, the output terminal 121 of the power amplifier 12 outputs an indefinite level that is close to 0 and that has a very small amplitude fluctuation. Even if such an indefinite level that is close to 0 and that has a very small amplitude fluctuation is transmitted to the load 13 using the coupling capacitor C1, a plosive is not generated. Therefore, when the power supply voltage output by the power supply module 11 is less than the first voltage threshold, the plosive suppression circuit 200 does not work, and the capacitor C1 does not need to be grounded. In this way, power consumption can be reduced.

After the power supply voltage output by the power supply module 11 rises to the first voltage threshold, the power supply voltage output by the power supply module 11 outputs an indefinite level with a relatively large amplitude fluctuation, and the indefinite level with a relatively large amplitude fluctuation may be transmitted to the load 13 using the coupling capacitor C1, thereby generating a plosive. In this embodiment of the present application, when the power supply voltage output by the power supply module 11 reaches the first voltage threshold, that is, the minimum voltage threshold at which the plosive suppression circuit 200 can work, the plosive suppression circuit 200 can start to work, and the first terminal of the coupling capacitor C1 is connected to the ground terminal GND. In this way, after the power supply module 11 is powered on and before the power amplifier 12 starts to work, a level at the output terminal 121 of the power amplifier 12 is prevented from jumping, thereby preventing a plosive generated because the jumping is easily transferred to the load 13 using the coupling capacitor C1.

The plosive suppression circuit 200 may include only one switching transistor, or may include one capacitor, one resistor, and one switching transistor.

For example, when the plosive suppression circuit 200 includes only one switching transistor, a first terminal of the switching transistor is connected to the ground terminal, a second terminal of the switching transistor is connected to the output terminal 121 of the power amplifier 12, and a control terminal of the switching transistor is directly connected to the output terminal 111 of the power supply module 11, where a turn-on voltage of the switching transistor is the first voltage threshold. The switching transistor may be any one of semiconductor switching transistors such as a metal-oxide semiconductor (MOS) field effect transistor, an insulated gate bipolar transistor (IGBT), and a triode. The plosive suppression circuit 200 in this embodiment of the present application includes only one switching transistor, such that material costs can be reduced.

When the plosive suppression circuit 200 includes one capacitor, one resistor, and one switching transistor, a first terminal of the capacitor, a first terminal of the resistor, and a control terminal of the switching transistor may be connected to the output terminal 111 of the power supply module 11; a first terminal of the switching transistor, a second terminal of the capacitor, and a second terminal of the resistor are connected to the ground terminal; and a second terminal of the switching transistor is connected to the output terminal 121 of the power amplifier 12. The plosive suppression circuit 200 in this embodiment of the present application includes the capacitor and the resistor that are connected in parallel, such that so as to ensure that a voltage at the control terminal of the switching transistor can slowly rise when the power supply module 11 is powered on, and impact on the switching transistor can be prevented when a voltage output by the output terminal 111 of the power supply module 11 is unstable. In this way, stability of working of the plosive suppression circuit 200 is ensured.

Optionally, the audio play circuit may further include a controller, and the controller is configured to disconnect the first terminal of the coupling capacitor C1 from the ground terminal before the power amplifier 12 performs normal analog signal amplification.

In this embodiment of the present application, to ensure that the power amplifier 12 is not affected by the other modules of the audio play circuit, generally, the power amplifier 12 starts to perform normal analog signal amplification and outputting only after all modules of the audio play circuit have been powered on and working states of all the modules are stable. After all the modules of the audio play circuit have been powered on and the working states of all the modules are stable, and before the power amplifier 12 performs normal analog signal amplification, because the power amplifier 12 is not affected by the other modules of the audio play circuit and therefore does not cause a plosive in this case, the controller may control the first terminal of the coupling capacitor C1 to be disconnected from the ground terminal, such that the audio play circuit recovers a normal audio play function.

In implementation of the audio play circuit shown in FIG. 2, the plosive suppression circuit is used, such that and the plosive suppression circuit starts to work at a relatively low voltage, to prevent a level jump at the output terminal of the power amplifier in a power-on process of the power supply module, and further prevent generation of a plosive resulting from coupling of the level jump to the load using the coupling capacitor. In this way, a plosive generated in the power-on process of the power supply module can be suppressed.

Figure 3:
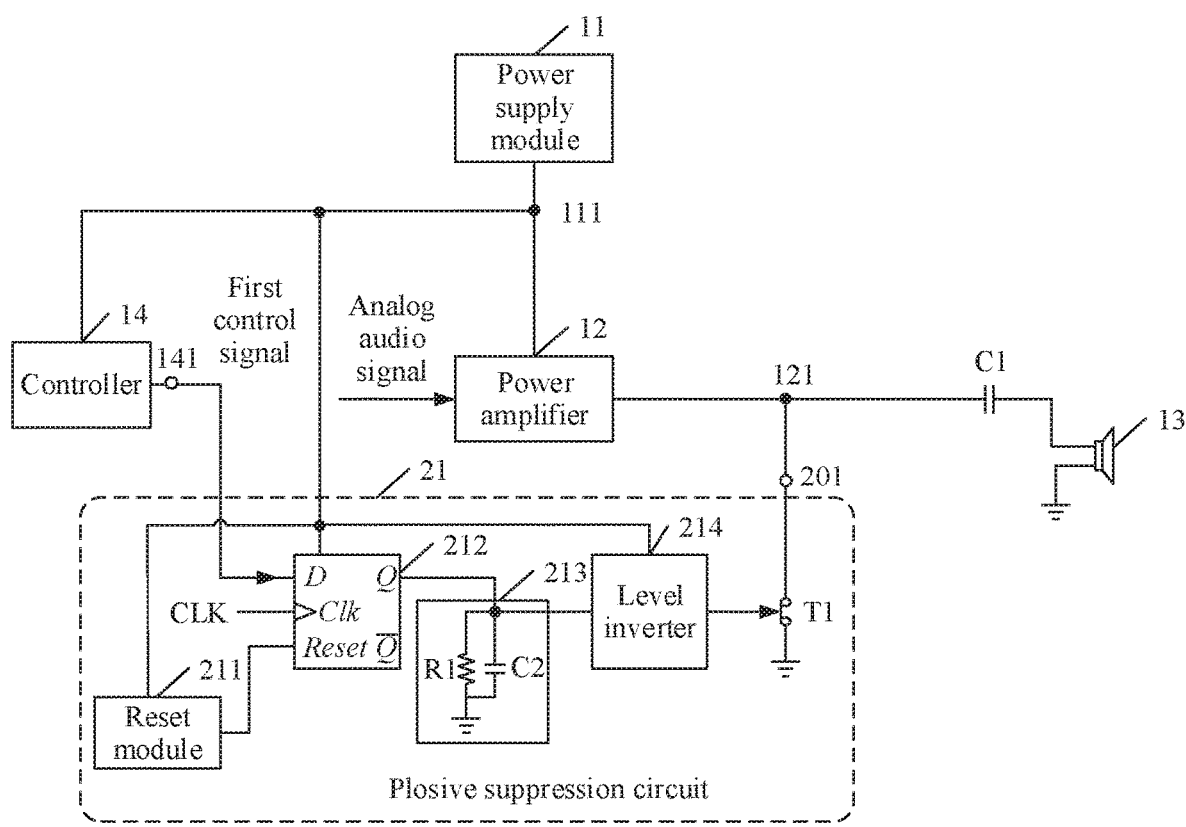
FIG. 3 is a schematic structural diagram of another audio play circuit according to an embodiment of the present application.

Optionally, FIG. 3 is a schematic structural diagram of another audio play circuit according to an embodiment of the present application, and FIG. 3 is obtained through further optimization based on FIG. 2. As shown in FIG. 3, the audio play circuit further includes a controller 14, and the plosive suppression circuit 200 includes a reset module 211, a flip-flop 212, a capacitor-resistor parallel module 213, a level inverter 214, and a first switching transistor T1. An output terminal of the reset module 211 is connected to a reset terminal of the flip-flop 212, an input terminal of the flip-flop 212 is connected to a first control terminal 141 of the controller 14, an output terminal of the flip-flop 212 is connected to a first terminal of the capacitor-resistor parallel module 213 and an input terminal of the level inverter 214, an output terminal of the level inverter 214 is connected to a control terminal of the first switching transistor T1, a first terminal of the first switching transistor T1 is connected to an output terminal 121 of a power amplifier 12, and a second terminal of the first switching transistor T1 and a second terminal of the capacitor-resistor parallel module 213 are connected to a ground terminal GND. A working voltage threshold of the level inverter 214 is equal to a first voltage threshold. To be specific, the level inverter 214 cannot work when a power supply voltage is less than the first voltage threshold, and starts to work when the power supply voltage reaches the first voltage threshold.

An output terminal of a power supply module 11 is connected to a power supply terminal of the controller 14, a power supply terminal of the reset module 211, a power supply terminal of the flip-flop 212, and a power supply terminal of the level inverter 214, and the power supply module 11 is configured to provide a direct current power supply voltage for the reset module 211, the flip-flop 212, and the level inverter 214.

The capacitor-resistor parallel module 213 is configured to: when the power supply module 11 starts to work, input a first low level signal to the input terminal of the level inverter 214.

The level inverter 214 is configured to: when the direct current power supply voltage rises to the first voltage threshold, output a first high level signal to the control terminal of the first switching transistor T1 based on the first low level signal, where the first high level signal is used to control the first switching transistor T1 to be turned on.

Optionally, a working voltage threshold of the reset module 211 is a second voltage threshold, a working voltage threshold of the flip-flop 212 is a third voltage threshold, and a working voltage threshold of the controller 14 is less than the second voltage threshold, where the second voltage threshold is greater than the first voltage threshold, and the second voltage threshold is less than or equal to the third voltage threshold.

The reset module 211 is configured to: when the direct current power supply voltage rises to the second voltage threshold, send a reset signal to the flip-flop 212.

The controller 14 is configured to: when the direct current power supply voltage rises to the second voltage threshold, output a second low level signal to the input terminal of the flip-flop 212 using the first control terminal 141.

The flip-flop 212 is configured to: when the direct current power supply voltage rises to the third voltage threshold, output the second low level signal to the input terminal of the level inverter 214 based on the reset signal and the second low level signal.

The level inverter 214 is further configured to output a second high level signal to the control terminal of the first switching transistor T1 based on the second low level signal, where the second high level signal is used to control the first switching transistor T1 to be turned on.

In this embodiment of the present application, the capacitor-resistor parallel module 213 is constituted by connecting a pull-down resistor R1 and a capacitor C2 in parallel, to prevent a rapid change of a level input by the level inverter 214. The level inverter 214 is configured to convert an input low level into a high level signal for outputting, and convert an input high level into a low level signal for outputting.

Because hardware features of the level inverter 214, the reset module 211, and the flip-flop 212 are different, the level inverter 214 can work at a relatively low working voltage threshold, and the flip-flop 212 needs to work at a relatively high working voltage threshold. For example, in a possible implementation, the working voltage threshold of the level inverter is 0.7 V, the working voltage threshold of the reset module 211 is 1.2 V, and the working voltage threshold of the flip-flop 212 is 1.4 V.

When the power supply voltage of the power supply module 11 is less than the first voltage threshold, none of the level inverter 214, the reset module 211, and the flip-flop 212 starts to work. In this case, output of the level inverter 214, the reset module 211, and the flip-flop 212 is an indefinite level close to 0. The capacitor-resistor parallel module 213 may pull down the indefinite level output by the flip-flop 212 an earth level, to prevent the indefinite state output by the flip-flop 212 in a power-on process from being coupled to the input terminal of the level inverter 214. This ensures that when the power supply module 11 is powered on and before the flip-flop 212 starts to work, a signal at the input terminal of the level inverter 214 is a low level signal and does not jump.

When the power supply voltage of the power supply module 11 is greater than the first voltage threshold and less than the second voltage threshold, the level inverter 214 starts to work, and the reset module 211 and the flip-flop 212 cannot work. In this case, because a signal at the input terminal of the level inverter 214 is a low level signal and does not jump, the level inverter 214 outputs a stable high level signal, to ensure that the first switching transistor T1 is stably in an on state. This ensures that a first terminal of a coupling capacitor C1 is pulled down to an earth level.

When the power supply voltage of the power supply module 11 is greater than the second voltage threshold and less than the third voltage threshold, the level inverter 214 continues to work, the reset module 211 starts to work, and the flip-flop 212 cannot work. Because the flip-flop 212 needs to work under the reset signal of the reset module 211, the reset module 211 starts to work to prepare for working of the flip-flop 212 before the flip-flop 212 works.

When the power supply voltage of the power supply module 11 is greater than the third voltage threshold, the level inverter 214 and the reset module 211 continue to work, and the flip-flop 212 starts to work. After the flip-flop 212 starts to work, the flip-flop 212 outputs the low level signal to the input terminal of the level inverter 214 based on the reset signal input by the reset module 211, a clock signal input by a clock generator, and the low level signal input by the controller 14. The level inverter 214 outputs a high level signal to the first switching transistor T1 based on the input low level signal, such that the first switching transistor T1 is turned on, and the first terminal of the coupling capacitor C1 continues to be pulled down to an earth level.

After all modules of the audio play circuit have been powered on and working states of all the modules are stable, and before the power amplifier 12 performs normal analog signal amplification, the controller 14 is configured to control the flip-flop 212 to output a high level signal to the input terminal of the level inverter 214 based on the reset signal input by the reset module 211, the clock signal input by the clock generator, and the high level signal input by the controller 14. The level inverter 214 outputs a low level signal to the first switching transistor T1 based on the input high level signal, such that the first switching transistor T1 is turned off. In this way, the first terminal of the coupling capacitor C1 is disconnected from the ground terminal. Compared with the low level signal output to the level inverter 214 by the capacitor-resistor parallel module 213, the low level signal output to the level inverter 214 by the flip-flop 212 is more controllable, such that stability of working of the plosive suppression circuit 200 can be further ensured in the power-on process of the power supply module 11.

In this embodiment of the present application, because the flip-flop 212 may accurately control the first switching transistor T1 using the clock signal and the controller 14, the first terminal of the coupling capacitor C1 may be accurately controlled to be connected to or disconnected from the ground terminal, thereby accurately suppressing a plosive.

The flip-flop 212 may be a D flip-flop, an RS flip-flop, or the like. The flip-flop in FIG. 3 and subsequent accompanying drawings is described using the D flip-flop as an example.

In this embodiment of the present application, the working voltage threshold of the level inverter 214 is the smallest, and is less than working voltage thresholds of the reset module 211 and the flip-flop 212. After the power supply module 11 is powered on and the level inverter 214 starts to work, the controller 14 and the reset module 211 control the flip-flop 212 to start to work, such that the flip-flop 212 outputs a low level signal to the input terminal of the level inverter 214. This ensures that the level inverter 214 continues to output a high level signal capable of turning on the first switching transistor T1. Compared with the low level signal output to the level inverter 214 by the capacitor-resistor parallel module 213, the low level signal output to the level inverter 214 by the flip-flop 212 is more controllable, such that stability of working of the plosive suppression circuit 200 can be further ensured in the power-on process of the power supply module 11.

Figure 4:
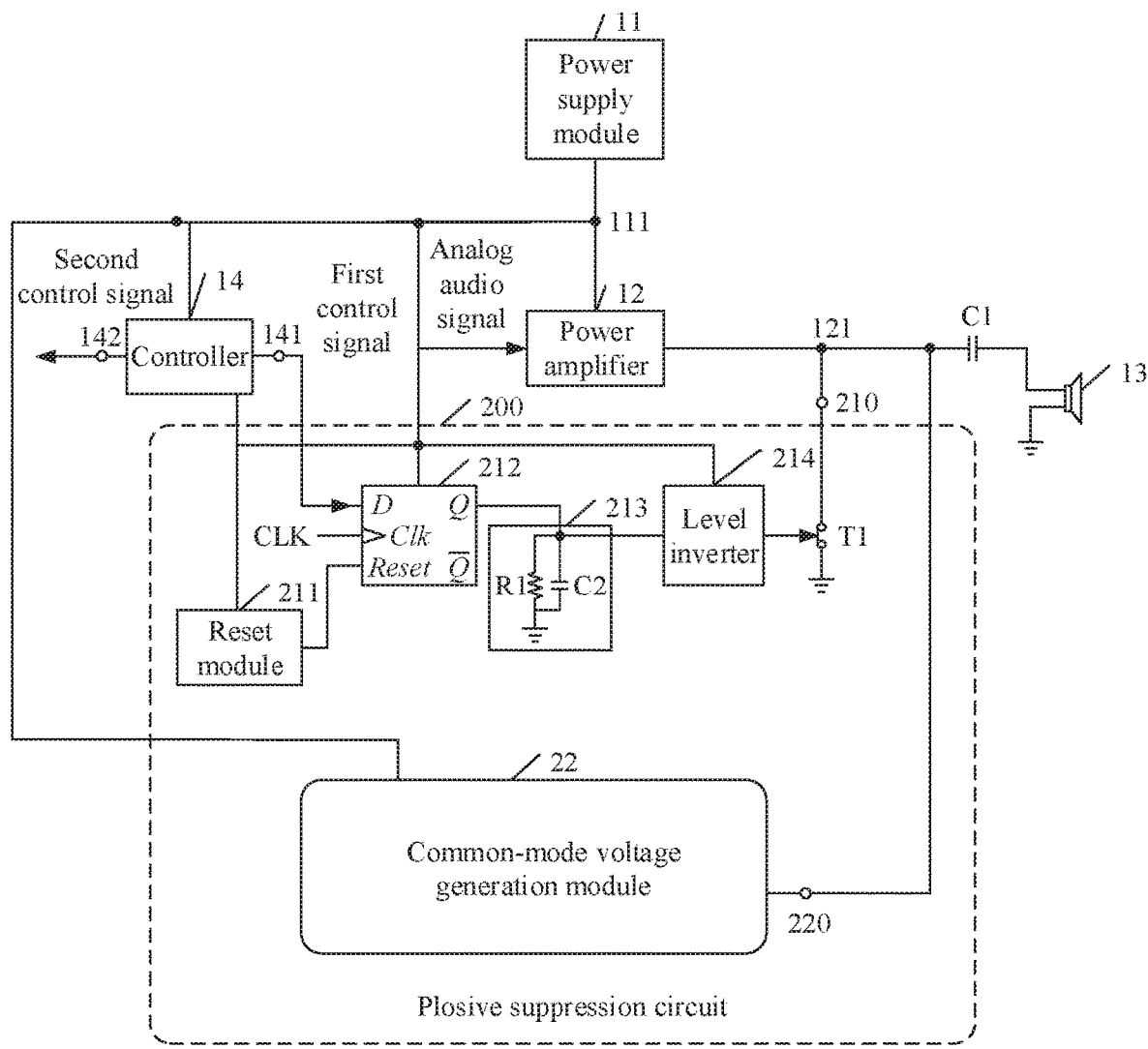
FIG. 4 is a schematic structural diagram of another audio play circuit according to an embodiment of the present application.

Optionally, FIG. 4 is a schematic structural diagram of another audio play circuit according to an embodiment of the present application, and FIG. 4 is obtained through further optimization based on FIG. 3. As shown in FIG. 4, the plosive suppression circuit 200 further includes a common-mode voltage generation module 22. An output terminal 220 of the common-mode voltage generation module 22 is connected to an output terminal 121 of a power amplifier 12, and an output terminal of a power supply module 11 is connected to a power supply terminal of the common-mode voltage generation module 22.

A controller 14 is further configured to: when a direct current power supply voltage is in a rising phase, control the output terminal 220 of the common-mode voltage generation module 22 to be disconnected from a ground terminal.

The controller 14 is further configured to: when the direct current power supply voltage stabilizes to a target voltage value, control the output terminal 220 of the common-mode voltage generation module 22 to be connected to the ground terminal.

In this embodiment of the present application, in a power-on process of the power supply module 11, the direct current power supply voltage output by the power supply module 11 gradually increases from 0 to the target voltage value. For example, the target voltage value may be 3.3 V. When the direct current power supply voltage is in the rising stage, to be specific, when the power supply module 11 is in the power-on process, to save power consumption, the common-mode voltage generation module 22 is disabled. The output terminal 220 of the common-mode voltage generation module 22 is disconnected from the ground terminal GND, a level of the output terminal 220 of the common-mode voltage generation module 22 is an indefinite level close to 0. When the direct current power supply voltage stabilizes to the target voltage value, to be specific, after the power supply module 11 has been powered on, the common-mode voltage generation module 22 can start to work, and the output terminal 220 of the common-mode voltage generation module 22 is connected to the ground terminal GND. The plosive suppression circuit 200 may ground a first terminal of a coupling capacitor C1 using a reset module 211, a flip-flop 212, a capacitor-resistor parallel module 213, a level inverter 214, and a first switching transistor T1 in the power-on process of the single power supply module 11. The plosive suppression circuit 200 may further ground the first terminal of the coupling capacitor C1 using the common-mode voltage generation module 22 after the single power supply module 11 has been powered on. This can ensure that the first terminal of the coupling capacitor C1 is always grounded after the power supply module 11 has been powered on and before a common-mode voltage is established. In this way, a plosive that may be generated in a process of establishing the common-mode voltage after the power supply module 11 has been powered on can be suppressed.

The common-mode voltage generation module 22 may include only one switching transistor, or may include one capacitor, one resistor, and one switching transistor.

For example, when the common-mode voltage generation module includes only one switching transistor, a first terminal of the switching transistor is connected to the ground terminal, a second terminal of the switching transistor is connected to the output terminal 121 of the power amplifier 12, and a control terminal of the switching transistor is directly connected to the output terminal 111 of the power supply module 11, where a turn-on voltage of the switching transistor is a second voltage threshold. The switching transistor may be a semiconductor switching transistor such as a metal-oxide-semiconductor field-effect transistor, an insulated gate bipolar transistor, or a triode. The common-mode voltage generation module 22 in this embodiment of the present application includes only one switching transistor, such that material costs can be saved.

When the common-mode voltage generation module 22 includes one capacitor, one resistor, and one switching transistor, a first terminal of the capacitor, a first terminal of the resistor, and a control terminal of the switching transistor may be connected to the output terminal 111 of the power supply module 11, a first terminal of the switching transistor, a second terminal of the capacitor, and a second terminal of the resistor are connected to the ground terminal, and a second terminal of the switching transistor is connected to the output terminal 121 of the power amplifier 12. The common-mode voltage generation module 22 in this embodiment of the present application includes the capacitor and the resistor that are connected in parallel, such that so as to ensure that a voltage at the control terminal of the switching transistor can rise slowly when the power supply module 11 is powered on, and impact on the switching transistor can be avoided when a voltage output by the output terminal 111 of the power supply module 11 is unstable. In this way, stability of working of the common-mode voltage generation module 22 is ensured.

In implementation of the plosive suppression circuit shown in FIG. 4, the common-mode voltage generation module is used, such that after the power supply module has been powered on and before the common-mode voltage is established, it can be ensured that the output terminal of the power amplifier is always grounded. In this way, a plosive that may be generated in the process of establishing the common-mode voltage after the power supply module 11 has been powered on can be suppressed.

Figure 5:
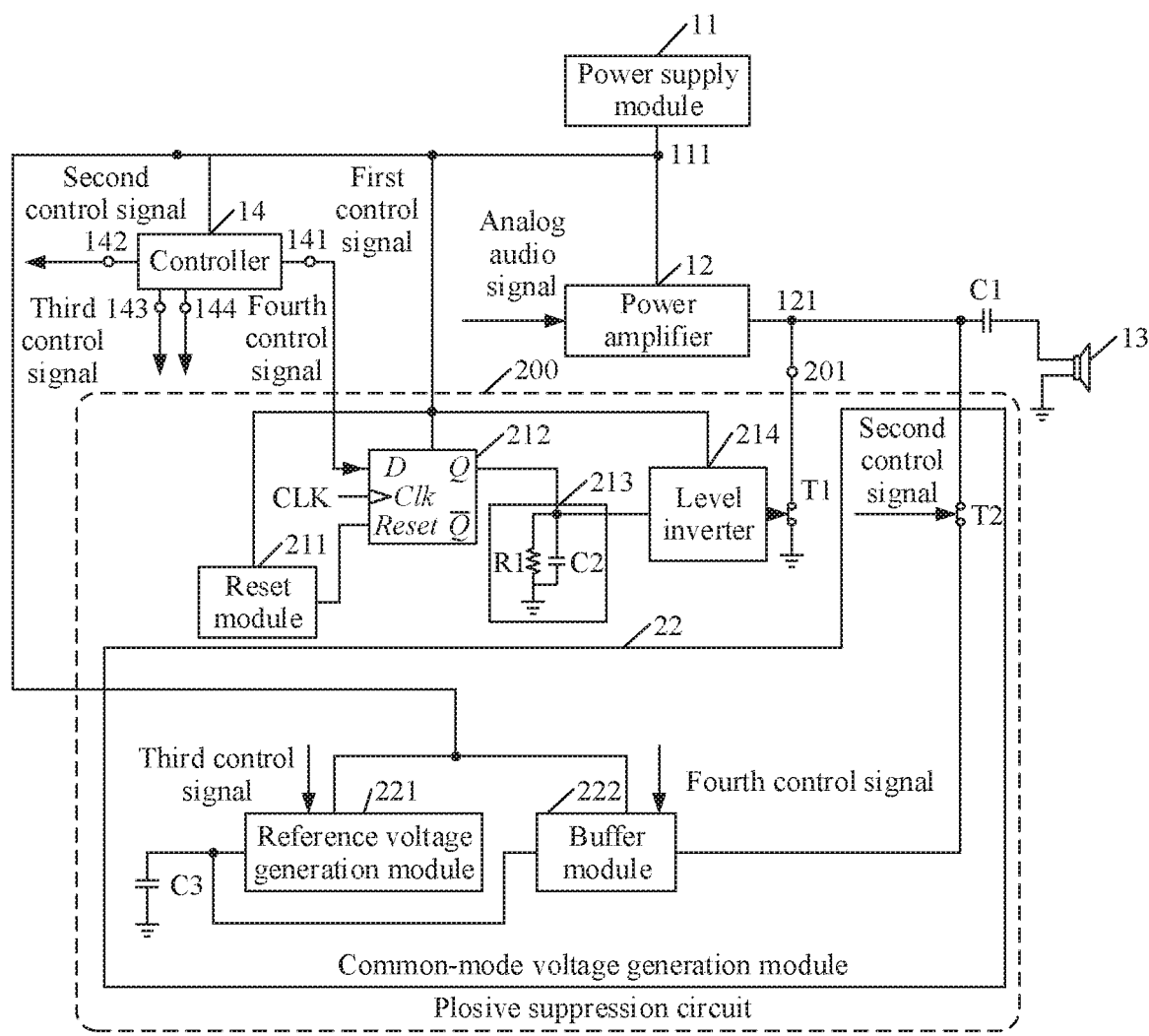
FIG. 5 is a schematic structural diagram of another audio play circuit according to an embodiment of the present application.

Optionally, FIG. 5 is a schematic structural diagram of another audio play circuit according to an embodiment of the present application, and FIG. 5 is obtained through further optimization based on FIG. 4. As shown in FIG. 5, a common-mode voltage generation module 22 includes a reference voltage generation module 221, an external capacitor C3, a buffer module 222, and a second switching transistor T2. An output terminal of the power supply module 11 is connected to a power supply terminal of the reference voltage generation module 221 and a power supply terminal of the buffer module 222, and the power supply module 11 is configured to provide a direct current power supply voltage for the reference voltage generation module 221 and the buffer module 222. An output terminal of the reference voltage generation module 221 is connected to a first terminal of the external capacitor C3 and an input terminal of the buffer module 222, an output terminal of the buffer module 222 is connected to a first terminal of the second switching transistor T2, and a second terminal of the second switching transistor T2 is connected to an output terminal 121 of a power amplifier 12. A control terminal of the second switching transistor T2 is connected to a second control terminal 142 of a controller 14, a third control terminal 143 of the controller 14 is connected to a control terminal of the reference voltage generation module 221, a fourth control terminal 144 of the controller 14 is connected to a control terminal of the buffer module 222, and a second terminal of the external capacitor C3 is connected to a ground terminal.

The controller 14 is configured to: when the direct current power supply voltage stabilizes to a target voltage value, output a second control signal to the control terminal of the second switching transistor T2 using the second control terminal 142, output a third control signal to the control terminal of the reference voltage generation module 221 using the third control terminal, and output a fourth control signal to the control terminal of the buffer module 222 using the fourth control terminal, where the second control signal is used to control the second switching transistor T2 to be turned on, the third control signal is used to control the reference voltage generation module 221 to stop working, and the fourth control signal is used to control the buffer module 222 to start to work.

In this embodiment of the present application, the common-mode voltage generation module 22 is configured to suppress a plosive caused by establishment of a common-mode voltage. After the power supply module 11 has been powered on and before the common-mode voltage is established, the controller 14 controls the reference voltage generation module 221 to stop working and controls the buffer module 222 to work. Because a voltage that is output when the reference voltage generation module 221 stops working is zero, the zero voltage that is output when the reference voltage generation module 221 stops working may be output to the output terminal 121 of the power amplifier 12 using the buffer module 222, to ensure that a first terminal of a coupling capacitor C1 is always in a grounded state. In this way, a plosive that may be generated after the power supply module 11 has been powered on can be suppressed. The reference voltage generation module 221 does not have a current driving capability, and cannot directly drive the output terminal 21 of the power amplifier 12. Therefore, the buffer module 222 is added, such that a reference voltage generated by the reference voltage generation module 221 can drive the output terminal 121 of the power amplifier 12.

The reference voltage generation module 221 and the external capacitor C3 are configured to provide a low-noise voltage reference.

Optionally, the controller 14 is further configured to: after the second switching transistor T2 is turned on, output a third high level signal to an input terminal of a flip-flop 212 using a first control terminal 141.

The flip-flop 212 is further configured to output the third high level signal to an input terminal of a level inverter 214.

The level inverter 214 is further configured to output a third low level signal to a control terminal of a first switching transistor T1 based on the third high level signal, where the third low level signal is used to control the first switching transistor T1 to be turned off.

The common-mode voltage may also be referred to as a reference voltage or a voltage reference, to provide one voltage reference. After the power supply module 11 has been powered on, and before the common-mode voltage is established, because the power supply module 11 has been powered on, to establish the common-mode voltage at the output terminal 121 of the power amplifier 12, the first switching transistor T1 is turned off using the controller 14. In this way, establishing the common-mode voltage at the output terminal 121 of the power amplifier 12 is not affected after the first switching transistor T1 is turned on.

Optionally, the controller 14 is further configured to: after the second switching transistor T2 is turned on and the first switching transistor T1 is turned off, output a fifth control signal to the control terminal of the reference voltage generation module 221 using the third control terminal 143, where the fifth control signal is used to control the reference voltage generation module 221 to start to work.

When the reference voltage generation module 221 starts to work, due to existence of the external capacitor C3, the reference voltage output by the reference voltage generation module 221 slowly rises to a final reference voltage value, and the buffer module 222 also outputs the slowly rising reference voltage to the output terminal 121 of the power amplifier 12, to drive a voltage at the output terminal 121 of the power amplifier 12 to be the final reference voltage value. In this way, the common-mode voltage is established at the output terminal 121 of the power amplifier 12. In a process of establishing the common-mode voltage, due to the existence of the external capacitor C3, the voltage at the output terminal 121 of the power amplifier 12 rises slowly and does not change abruptly, such that the plosive that may be generated in the process of establishing the common-mode voltage can be suppressed. After the common-mode voltage at the output terminal 121 of the power amplifier 12 is established, and when the power amplifier 12 starts to work, because input of the power amplifier 12 is zero, a voltage initially output by the power amplifier 12 is also a common-mode voltage, and a voltage jump is not caused at the output terminal 121 of the power amplifier 12. In this way, a plosive that may be generated when the power amplifier 12 initially starts to work is suppressed. In this embodiment of the present application, the reference voltage generation module 221, the external capacitor C3, and the buffer module 222 are used together to implement that the common-mode voltage slowly ramps from 0 to the final reference voltage value.

Optionally, a capacitance value of the external capacitor C3 is greater than a preset capacitance threshold. The capacitance value of the external capacitor is set as large as possible, such that stability of the reference voltage generated by the reference voltage generation module 221 can be ensured, and fluctuation is not likely to occur.

The following describes a working principle process of a plosive suppression circuit 200 with reference to FIG. 5.

(1) When the power supply module 11 is not powered on, all circuit modules cannot work, and a level of the output terminal 121 of the power amplifier 12 is an indefinite state close to 0.

(2) When the power supply module 11 starts to be powered on, the direct current power supply voltage output by the power supply module 11 gradually increases. When the direct current power supply voltage output by the power supply module 11 is less than a first voltage threshold, a reset module 211, the flip-flop 212, and the level inverter 214 in the plosive suppression circuit 200 cannot work, an output terminal of the flip-flop 212 is an indefinite level, and such an indefinite level is pulled down to an earth level by a pull-down resistor R1 in a capacitor-resistor parallel module 213 after passing through the capacitor-resistor parallel module 213. Therefore, a level of the input terminal of the level inverter 214 is a zero. In this case, all the circuit modules cannot work, but levels of output terminals of these modules are indefinite states close to 0.

(3) The power supply module 11 continues to be powered on, and when a voltage VDD output by the power supply module 11 reaches a working voltage threshold (the first voltage threshold) of the level inverter 214, the plosive suppression circuit 200 starts to work, and the level inverter 214 outputs a high level signal to the first switching transistor T1 based on the input zero level, such that the first switching transistor T1 is turned on, and the output terminal 121 of the power amplifier 12 is pulled down to the earth level using the first switching transistor T1.

(4) The power supply module 11 continues to be powered on, and when the voltage VDD output by the power supply module 11 reaches a working voltage threshold (a third voltage threshold) of the flip-flop 212, the controller 14, the reset module 211, and the flip-flop 212 start to work, the flip-flop 212 outputs a low level signal to the input terminal of the level inverter 214 based on a reset signal input by the reset module 211 and the low level signal input by the controller 14, and the level inverter 214 outputs a high level signal to the first switching transistor T1 based on the input low level signal, such that the first switching transistor T1 is turned on, and the output terminal 121 of the power amplifier 12 continues to be pulled down to the earth level.

(5) The voltage VDD output by the power supply module 11 continues to rise until power-on is completed. After the power supply module 11 has been powered on, the controller 14 turns on the buffer module 222 and turns off the reference voltage generation module 221, in this case, output of the reference voltage generation module 221 is 0. In addition, the controller 14 controls the second switching transistor T2 to be turned on, and pulls down the output terminal 121 of the power amplifier 12 to the earth level using the second switching transistor T2. In this case, the output terminal 121 of the power amplifier 12 is pulled down to the earth level (that is, the level 0) by both the first switching transistor T1 and the second switching transistor T2. Therefore, the output terminal 121 of the power amplifier 12 does not undergo a level jump.

(6) After the second switching transistor T2 is turned on, the first control terminal 141 of the controller 14 outputs the high level signal, such that the first switching transistor T1 is turned off. In a power-on process of the power supply module 11, the first terminal of the coupling capacitor C1 is always the earth level. Therefore, the output terminal 121 of the power amplifier 12 does not undergo the level jump, and a plosive is not generated in the power-on process of the power supply module 11.

(7) After the second switching transistor T2 is turned on and the first switching transistor T1 is turned off, the controller 14 controls the reference voltage generation module 221 to start to work, due to the existence of the external capacitor C3, the reference voltage output by the reference voltage generation module 221 slowly rises to the final reference voltage value, and the buffer module 222 also outputs the slowly rising reference voltage to the output terminal 121 of the power amplifier 12, to drive the voltage at the output terminal 121 of the power amplifier 12 to be the final reference voltage value. In this way, the common-mode voltage is established at the output terminal 121 of the power amplifier 12. In the process of establishing the common-mode voltage, the voltage at the output terminal 121 of the power amplifier 12 rises slowly and does not change abruptly, such that the plosive that may be generated in the process of establishing the common-mode voltage can be suppressed. After the common-mode voltage at the output terminal 121 of the power amplifier 12 is established, and when the power amplifier 12 starts to work, because the input of the power amplifier 12 is zero, the voltage initially output by the power amplifier 12 is also a common-mode voltage, and the voltage jump is not caused at the output terminal 121 of the power amplifier 12. In this way, a plosive caused by a voltage change at the output terminal 121 of the power amplifier 12 is suppressed.

Figure 6:
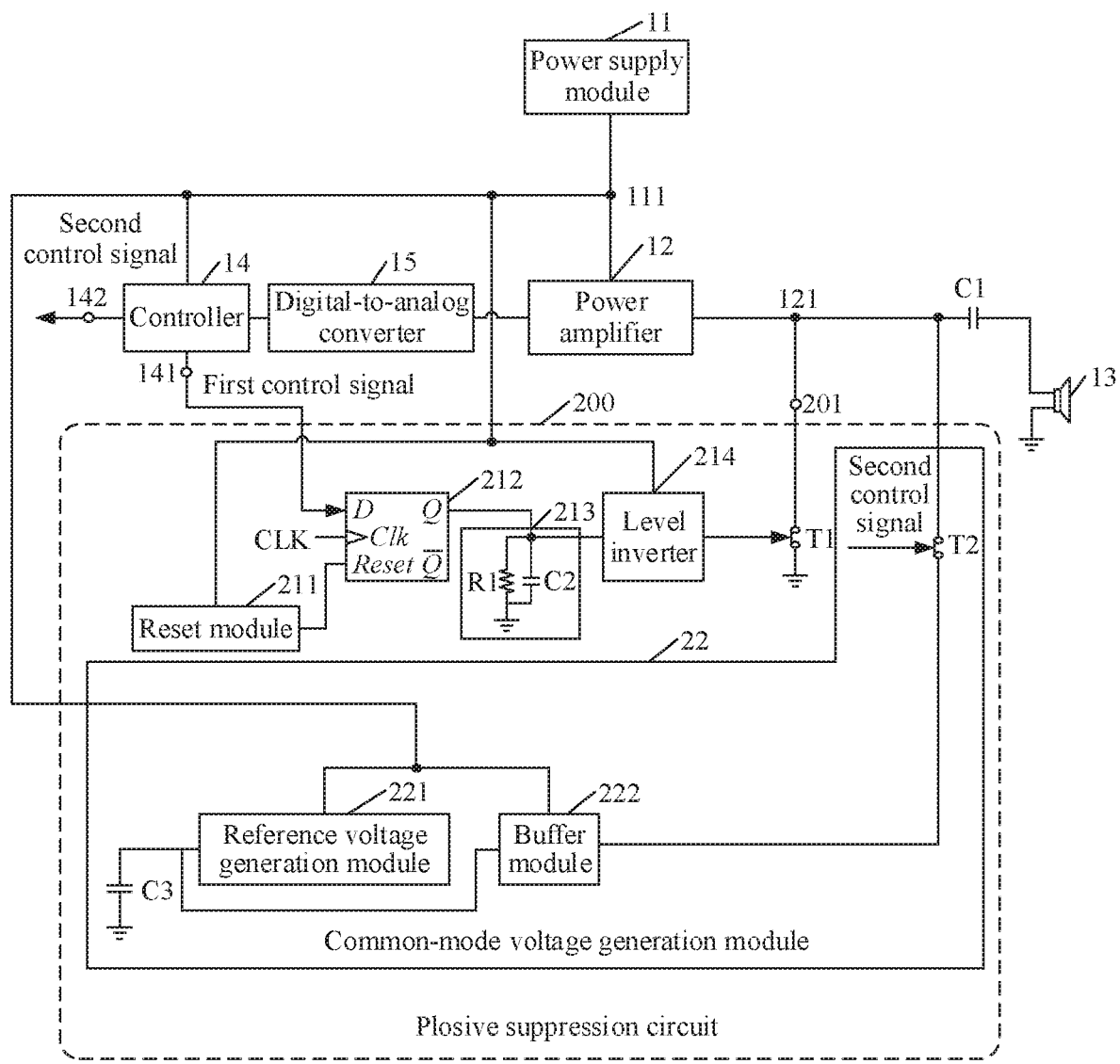
FIG. 6 is a schematic structural diagram of another audio play circuit according to an embodiment of the present application.

Optionally, FIG. 6 is a schematic structural diagram of another audio play circuit according to an embodiment of the present application. The audio play circuit further includes a digital-to-analog converter 15, an input terminal of the digital-to-analog converter 15 is connected to an output terminal of a controller 14, an output terminal of the digital-to-analog converter 15 is connected to an input terminal of a power amplifier 12, and a power supply terminal of the digital-to-analog converter 15 is connected to an output terminal of a power supply module 11.

The digital-to-analog converter 15 is configured to convert a digital audio signal output by the controller 14 into an analog audio signal, and output the analog audio signal to the power amplifier 12.

In this embodiment of the present application, the controller 14 may output the digital audio signal to the digital-to-analog converter 15, and the digital-to-analog converter 15 converts the digital audio signal into the analog audio signal and outputs the analog audio signal to the power amplifier 12, and then the power amplifier 12 amplifies the analog audio signal and outputs an amplified analog audio signal to a load 13.

Optionally, when the power supply module 11 works, a voltage change rate in a process in which a direct current power supply voltage output by the power supply module 11 changes from zero to a target voltage value is less than a preset change rate threshold.

The direct current power supply voltage output by the power supply module 11 is not a target voltage value that jumps from zero to a final target voltage value, but has a slow rising process, to avoid a case in which a plosive suppression effect of the plosive suppression circuit 200 is affected because the plosive suppression circuit 200 fails to respond in a timely manner due to a sudden change of a voltage output by the power supply module 11.

Figure 7:
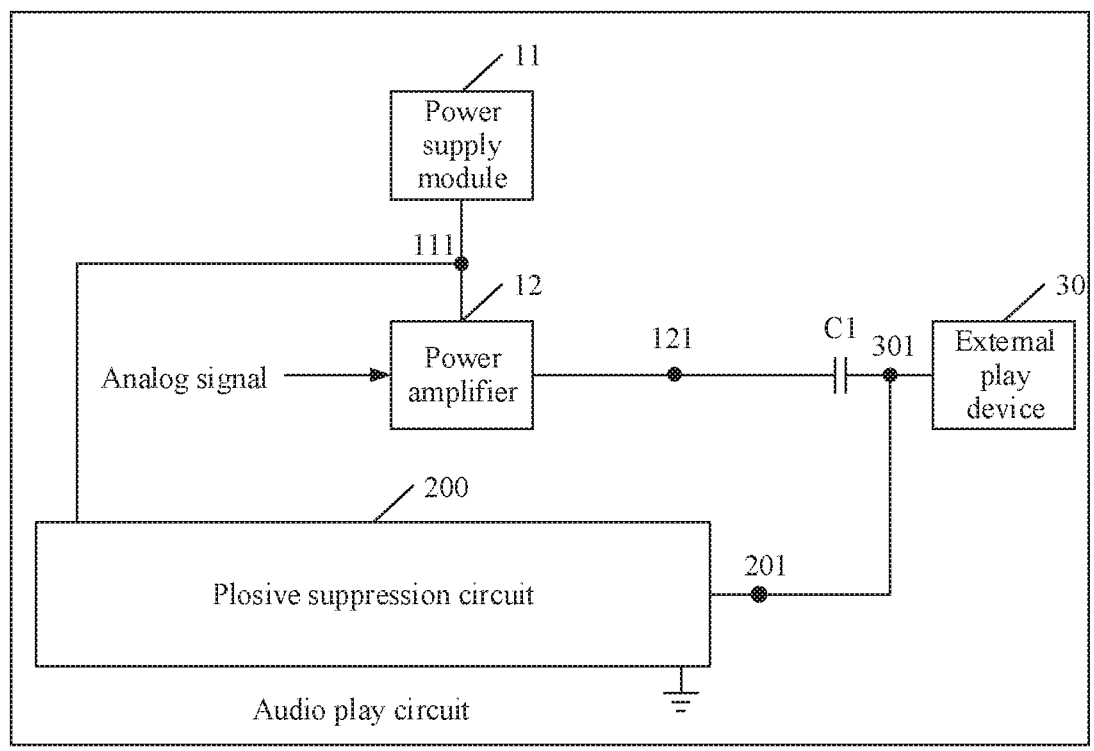
FIG. 7 is a schematic structural diagram of another audio play circuit according to an embodiment of the present application.

Optionally, FIG. 7 is a schematic structural diagram of another audio play circuit according to an embodiment of the present application. The audio play circuit includes a power supply module 11, a power amplifier 12, a coupling capacitor C1, an external play device 30, and a plosive suppression circuit 200, where the power amplifier 12 is configured to receive an analog signal, amplify the analog signal, and output an amplified analog signal to the external play device 30 using the coupling capacitor C1;

the power supply module 11 is configured to provide a working voltage for the power amplifier 12 and the plosive suppression circuit 200;

two terminals of the coupling capacitor C1 are respectively connected to an output terminal 121 of the power amplifier 12 and an input terminal 301 of the external play device 30; and the plosive suppression circuit 200 is configured to: when the working voltage exceeds a threshold, ground one terminal of the coupling capacitor C1.

In this embodiment of the present application, the one terminal of the coupling capacitor C1 may be a first terminal of the coupling capacitor C1, or may be a second terminal of the coupling capacitor C1. The plosive suppression circuit 200 may ground the output terminal 121 of the power amplifier 12 or the input terminal 301 of the external play device 30 when the working voltage exceeds the threshold.

In implementation of the audio play circuit shown in FIG. 7, such that the plosive suppression circuit 200 may ground the one terminal of the coupling capacitor C1 when the working voltage output by the power supply module 11 exceeds the threshold, to prevent generation of a plosive resulting from coupling of a level jump at the output terminal of the power amplifier 12 in a power-on process of the power supply module 11 to the external play device 30 using the coupling capacitor C1. In this way, a plosive generated in the power-on process of the power supply module 11 can be suppressed.

An embodiment of the present application further discloses an audio play device. The audio play device may include the audio play circuit shown in any one of FIG. 2 to FIG. 6.

It should be noted that the terms such as "first", "second", "third", "fourth", and "fifth" in the embodiments of the present application are used to distinguish different objects but are not used to describe a specific order.

The audio play circuit in the embodiments of the present application may be applied to a mobile terminal such as a mobile phone or a tablet computer, or may be applied to an audio play device such as a sound box or a television player. The controller 14 in the embodiments of the present application may be a microcontroller unit (MCU) in an audio play device, or may be an application processor (AP) in a mobile terminal.

In summary, according to the embodiments of the present application, in the power-on process of the power supply module, before the power amplifier starts to work, a low voltage working module grounds the output terminal of the power amplifier, to prevent the level jump at the output terminal of the power amplifier in the power-on process of the power supply module, and further prevent generation of a plosive resulting from coupling of the level jump to the load using the coupling capacitor. In this way, a plosive generated in the power-on process of the power supply module can be suppressed.

What is claimed is:

1. An audio play circuit, comprising a power supply circuit, a power amplifier, a coupling capacitor, a load, a controller, a common-mode voltage generation circuit, and a plosive suppression circuit, wherein:
   an output terminal of the power amplifier is respectively connected to a first terminal of the coupling capacitor and an output terminal of the plosive suppression circuit, wherein a second terminal of the coupling capacitor is connected to the load, wherein an output terminal of the power supply circuit is respectively connected to a power supply terminal of the power amplifier and a power supply terminal of the plosive suppression circuit, wherein an output terminal of the common-mode voltage generation circuit is connected to the output terminal of the power amplifier, wherein the output terminal of the power supply circuit is connected to a power supply terminal of the common-mode voltage generation circuit, and wherein the power supply circuit is configured to provide a direct current power supply voltage for the power amplifier and the plosive suppression circuit;
   the plosive suppression circuit is configured to: when the direct current power supply voltage is less than a first voltage threshold, disconnect the first terminal of the coupling capacitor from a ground terminal, wherein the first voltage threshold is less than a working voltage threshold of the power amplifier;
   the plosive suppression circuit is further configured to: when the direct current power supply voltage rises to the first voltage threshold, connect the first terminal of the coupling capacitor to the ground terminal; and
   the controller is configured to:
      control the output terminal of the common-mode voltage generation circuit to be disconnected from the ground terminal when the direct current power supply voltage is in a rising phase; and
      control the output terminal of the common-mode voltage generation circuit to be connected to the ground terminal when the direct current power supply voltage stabilizes to a target voltage value.

2. The audio play circuit of claim 1, wherein the plosive suppression circuit comprises a reset circuit, a flip-flop, a capacitor-resistor parallel circuit, a level inverter, and a first switching transistor, wherein an output terminal of the reset circuit is connected to a reset terminal of the flip-flop, wherein an input terminal of the flip-flop is connected to a first control terminal of the controller, wherein an output terminal of the flip-flop is respectively connected to a first terminal of the capacitor-resistor parallel circuit and an input terminal of the level inverter, wherein an output terminal of the level inverter is connected to a control terminal of the first switching transistor, wherein a first terminal of the first switching transistor is connected to the output terminal of the power amplifier, wherein a second terminal of the first switching transistor and a second terminal of the capacitor-resistor parallel circuit are connected to the ground terminal, and wherein a working voltage threshold of the level inverter is equal to the first voltage threshold;
   wherein the output terminal of the power supply circuit is connected to a power supply terminal of the controller, a power supply terminal of the reset circuit, a power supply terminal of the flip-flop, and a power supply terminal of the level inverter, and wherein the power supply circuit is configured to provide the direct current power supply voltage for the reset circuit, the flip-flop, and the level inverter;
   wherein the capacitor-resistor parallel circuit is configured to: input a first low level signal to the input terminal of the level inverter when the power supply circuit starts to work; and
   wherein the level inverter is configured to: output a first high level signal to the control terminal of the first switching transistor based on the first low level signal when the direct current power supply voltage rises to the first voltage threshold, wherein the first high level signal is used to control the first switching transistor to be turned on.

3. The audio play circuit of claim 2, wherein a working voltage threshold of the reset circuit is a second voltage threshold, wherein a working voltage threshold of the flip-flop is a third voltage threshold, and wherein a working voltage threshold of the controller is less than the second voltage threshold, wherein the second voltage threshold is greater than the first voltage threshold, and wherein the second voltage threshold is less than or equal to the third voltage threshold;
   wherein the reset circuit is configured to: send a reset signal to the flip-flop when the direct current power supply voltage rises to the second voltage threshold;
   wherein the controller is configured to: output a second low level signal to the input terminal of the flip-flop using the first control terminal when the direct current power supply voltage rises to the second voltage threshold;
   wherein the flip-flop is configured to: output the second low level signal to the input terminal of the level inverter based on the reset signal and the second low level signal when the direct current power supply voltage rises to the third voltage threshold; and wherein the level inverter is further configured to output a second high level signal to the control terminal of the first switching transistor based on the second low level signal, wherein the second high level signal is used to control the first switching transistor to be turned on.

4. The audio play circuit of claim 3, wherein when the power supply circuit works, a voltage change rate in a process in which a direct current power supply voltage output by the power supply circuit changes from zero to the target voltage value is less than a preset change rate threshold.

5. The audio play circuit of claim 2, wherein the common-mode voltage generation circuit comprises a reference voltage generation circuit, an external capacitor, a buffer circuit, and a second switching transistor, wherein the output terminal of the power supply circuit is connected to a power supply terminal of the reference voltage generation circuit and a power supply terminal of the buffer circuit, wherein the power supply circuit is configured to provide the direct current power supply voltage for the reference voltage generation circuit and the buffer circuit, wherein an output terminal of the reference voltage generation circuit is respectively connected to a first terminal of the external capacitor and an input terminal of the buffer circuit, wherein an output terminal of the buffer circuit is connected to a first terminal of the second switching transistor, wherein a second terminal of the second switching transistor is connected to the output terminal of the power amplifier, wherein a control terminal of the second switching transistor is connected to a second control terminal of the controller, wherein a third control terminal of the controller is connected to a control terminal of the reference voltage generation circuit, wherein a fourth control terminal of the controller is connected to a control terminal of the buffer circuit, and wherein a second terminal of the external capacitor is connected to the ground terminal; and wherein the controller is further configured to:
output a second control signal to the control terminal of the second switching transistor using the second control terminal when the direct current power supply voltage stabilizes to the target voltage value;
output a third control signal to the control terminal of the reference voltage generation circuit using the third control terminal; and
output a fourth control signal to the control terminal of the buffer circuit using the fourth control terminal, wherein the second control signal is used to control the second switching transistor to be turned on, wherein the third control signal is used to control the reference voltage generation circuit to stop working, and wherein the fourth control signal is used to control the buffer circuit to start to work.

6. The audio play circuit of claim 5, wherein:
the controller is further configured to: output a third high level signal to the input terminal of the flip-flop using the first control terminal after the second switching transistor is turned on;
the flip-flop is further configured to output the third high level signal to the input terminal of the level inverter; and
the level inverter is further configured to output a third low level signal to the control terminal of the first switching transistor based on the third high level signal, wherein the third low level signal is used to control the first switching transistor to be turned off.

7. The audio play circuit of claim 6, wherein:
the controller is further configured to: output a fifth control signal to the control terminal of the reference voltage generation circuit using the third control terminal after the second switching transistor is turned on and the first switching transistor is turned off, wherein the fifth control signal is used to control the reference voltage generation circuit to start to work.

8. The audio play circuit of claim 2, wherein the audio play circuit further comprises a digital-to-analog converter, wherein an input terminal of the digital-to-analog converter is connected to an output terminal of the controller, wherein an output terminal of the digital-to-analog converter is connected to an input terminal of the power amplifier, and wherein a power supply terminal of the digital-to-analog converter is connected to the output terminal of the power supply circuit; and wherein the digital-to-analog converter is configured to:
convert a digital audio signal output by the controller into an analog audio signal; and
output the analog audio signal to the power amplifier.

9. An audio play device, comprising an audio play circuit, wherein the audio play circuit comprises a power supply circuit, a power amplifier, a coupling capacitor, a load, a controller, a common-mode voltage generation circuit, and a plosive suppression circuit, wherein:
an output terminal of the power amplifier is respectively connected to a first terminal of the coupling capacitor and an output terminal of the plosive suppression circuit, wherein a second terminal of the coupling capacitor is connected to the load, wherein an output terminal of the power supply circuit is respectively connected to a power supply terminal of the power amplifier and a power supply terminal of the plosive suppression circuit, wherein an output terminal of the common-mode voltage generation circuit is connected to the output terminal of the power amplifier, wherein the output terminal of the power supply circuit is connected to a power supply terminal of the common-mode voltage generation circuit, and wherein the power supply circuit is configured to provide a direct current power supply voltage for the power amplifier and the plosive suppression circuit;
the plosive suppression circuit is configured to: when the direct current power supply voltage is less than a first voltage threshold, disconnect the first terminal of the coupling capacitor from a ground terminal, wherein the first voltage threshold is less than a working voltage threshold of the power amplifier;
the plosive suppression circuit is further configured to: when the direct current power supply voltage rises to the first voltage threshold, connect the first terminal of the coupling capacitor to the ground terminal; and
the controller is configured to:
control the output terminal of the common-mode voltage generation circuit to be disconnected from the ground terminal when the direct current power supply voltage is in a rising phase; and
control the output terminal of the common-mode voltage generation circuit to be connected to the ground terminal when the direct current power supply voltage stabilizes to a target voltage value.

10. An audio play circuit, comprising a power supply circuit, a power amplifier, a coupling capacitor, a load, and a plosive suppression circuit, wherein:
an output terminal of the power amplifier is respectively connected to a first terminal of the coupling capacitor and an output terminal of the plosive suppression circuit, wherein a second terminal of the coupling capacitor is connected to the load, wherein an output terminal of the power supply circuit is respectively connected to a power supply terminal of the power amplifier and a power supply terminal of the plosive suppression circuit, and wherein the power supply circuit is configured to provide a direct current power supply voltage for the power amplifier and the plosive suppression circuit;

wherein the audio play circuit further comprises a controller, and wherein the plosive suppression circuit comprises a flip-flop, a capacitor-resistor parallel circuit, and a first switching transistor, wherein an input terminal of the flip-flop is connected to a first control terminal of the controller, wherein an output terminal of the flip-flop is respectively connected to a first terminal of the capacitor-resistor parallel circuit, wherein a first terminal of the first switching transistor is connected to the output terminal of the power amplifier, wherein a second terminal of the first switching transistor and a second terminal of the capacitor-resistor parallel circuit are connected to the ground terminal;

wherein the output terminal of the power supply circuit is connected to a power supply terminal of the controller, a power supply terminal of the flip-flop, and wherein the power supply circuit is configured to provide the direct current power supply voltage for the flip-flop.

11. The audio play circuit of claim 10, wherein the plosive suppression circuit is configured to: when the direct current power supply voltage is less than a first voltage threshold, disconnect the first terminal of the coupling capacitor from a ground terminal, wherein the first voltage threshold is less than a working voltage threshold of the power amplifier; and the plosive suppression circuit is further configured to:
when the direct current power supply voltage rises to the first voltage threshold, connect the first terminal of the coupling capacitor to the ground terminal.

12. The audio play circuit of claim 11, wherein the audio play circuit further comprises a reset circuit, and a level inverter, wherein an output terminal of the reset circuit is connected to a reset terminal of the flip-flop, wherein an output terminal of the flip-flop is further connected to an input terminal of the level inverter, wherein an output terminal of the level inverter is connected to a control terminal of the first switching transistor, and wherein a working voltage threshold of the level inverter is equal to the first voltage threshold;

wherein the output terminal of the power supply circuit is further connected to a power supply terminal of the reset circuit, and a power supply terminal of the level inverter, and wherein the power supply circuit is further configured to provide the direct current power supply voltage for the reset circuit, and the level inverter.

13. The audio play circuit of claim 12, wherein a working voltage threshold of the reset circuit is a second voltage threshold, wherein a working voltage threshold of the flip-flop is a third voltage threshold, and wherein a working voltage threshold of the controller is less than the second voltage threshold, wherein the second voltage threshold is greater than the first voltage threshold, and wherein the second voltage threshold is less than or equal to the third voltage threshold;

wherein the controller is configured to: output a second low level signal to the input terminal of the flip-flop using the first control terminal when the direct current power supply voltage rises to the second voltage threshold;

wherein the flip-flop is configured to: output the second low level signal to the input terminal of the level inverter based on a reset signal and the second low level signal when the direct current power supply voltage rises to the third voltage threshold; and wherein the level inverter is further configured to output a second high level signal to the control terminal of the first switching transistor based on the second low level signal, wherein the second high level signal is used to control the first switching transistor to be turned on.

14. The audio play circuit of claim 10, wherein the plosive suppression circuit further comprises a common-mode voltage generation circuit, wherein an output terminal of the common-mode voltage generation circuit is connected to the output terminal of the power amplifier, and wherein the output terminal of the power supply circuit is connected to a power supply terminal of the common-mode voltage generation circuit;

wherein the controller is further configured to: control the output terminal of the common-mode voltage generation circuit to be disconnected from the ground terminal when the direct current power supply voltage is in a rising phase; and wherein the controller is further configured to: control the output terminal of the common-mode voltage generation circuit to be connected to the ground terminal when the direct current power supply voltage stabilizes to a target voltage value.

15. The audio play circuit of claim 14, wherein the common-mode voltage generation circuit comprises a reference voltage generation circuit, an external capacitor, a buffer circuit, and a second switching transistor, wherein the output terminal of the power supply circuit is connected to a power supply terminal of the reference voltage generation circuit and a power supply terminal of the buffer circuit, wherein the power supply circuit is configured to provide the direct current power supply voltage for the reference voltage generation circuit and the buffer circuit, wherein an output terminal of the reference voltage generation circuit is respectively connected to a first terminal of the external capacitor and an input terminal of the buffer circuit, wherein an output terminal of the buffer circuit is connected to a first terminal of the second switching transistor, wherein a second terminal of the second switching transistor is connected to the output terminal of the power amplifier, wherein a control terminal of the second switching transistor is connected to a second control terminal of the controller, wherein a third control terminal of the controller is connected to a control terminal of the reference voltage generation circuit, wherein a fourth control terminal of the controller is connected to a control terminal of the buffer circuit, and wherein a second terminal of the external capacitor is connected to the ground terminal; and wherein the controller is further configured to:
output a second control signal to the control terminal of the second switching transistor using the second control terminal when the direct current power supply voltage stabilizes to the target voltage value;

output a third control signal to the control terminal of the reference voltage generation circuit using the third control terminal; and output a fourth control signal to the control terminal of the buffer circuit using the fourth control terminal, wherein the second control signal is used to control the second switching transistor to be turned on, wherein the third control signal is used to control the reference voltage generation circuit to stop working, and wherein the fourth control signal is used to control the buffer circuit to start to work.

16. The audio play circuit of claim 15, wherein:

the controller is further configured to: output a third high level signal to the input terminal of the flip-flop using the first control terminal after the second switching transistor is turned on;

the flip-flop is further configured to output the third high level signal to the input terminal of the level inverter; and the level inverter is further configured to output a third low level signal to the control terminal of the first switching transistor based on the third high level signal, wherein the third low level signal is used to control the first switching transistor to be turned off.

17. The audio play circuit of claim 16, wherein:

the controller is further configured to: output a fifth control signal to the control terminal of the reference voltage generation circuit using the third control terminal after the second switching transistor is turned on and the first switching transistor is turned off, wherein the fifth control signal is used to control the reference voltage generation circuit to start to work.

18. The audio play circuit of claim 10, wherein the audio play circuit further comprises a digital-to-analog converter, wherein an input terminal of the digital-to-analog converter is connected to an output terminal of the controller, wherein an output terminal of the digital-to-analog converter is connected to an input terminal of the power amplifier, and wherein a power supply terminal of the digital-to-analog converter is connected to the output terminal of the power supply circuit; and wherein the digital-to-analog converter is configured to:
convert a digital audio signal output by the controller into an analog audio signal; and
output the analog audio signal to the power amplifier.

19. The audio play circuit of claim 10, wherein when the power supply circuit works, a voltage change rate in a process in which a direct current power supply voltage output by the power supply circuit changes from zero to a target voltage value is less than a preset change rate threshold.

* * * * *